US007952096B2

(12) United States Patent
Rhodes

(10) Patent No.: US 7,952,096 B2
(45) Date of Patent: May 31, 2011

(54) CMOS IMAGE SENSOR WITH IMPROVED BACKSIDE SURFACE TREATMENT

(75) Inventor: Howard E. Rhodes, San Martin, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 318 days.

(21) Appl. No.: 12/330,226

(22) Filed: Dec. 8, 2008

(65) Prior Publication Data
US 2010/0140675 A1    Jun. 10, 2010

(51) Int. Cl.
*H01L 29/04* (2006.01)
(52) U.S. Cl. ............ 257/59; 257/72; 257/290; 257/292; 257/E27.13; 438/48; 438/57
(58) Field of Classification Search .................... 257/59, 257/72, 88–93, 290–294, E27.13; 438/48, 438/37
See application file for complete search history.

(56) References Cited

U.S. PATENT DOCUMENTS

| | | | | |
|---|---|---|---|---|
| 5,688,715 | A | * | 11/1997 | Sexton et al. .................... 438/75 |
| 5,911,106 | A | | 6/1999 | Tasaka |
| 6,019,796 | A | | 2/2000 | Mei et al. |
| 6,124,179 | A | | 9/2000 | Adamic, Jr. |
| 2001/0044175 | A1 | | 11/2001 | Barrett et al. |
| 2006/0006488 | A1 | | 1/2006 | Kanbe |
| 2007/0207566 | A1 | | 9/2007 | Fu et al. |
| 2009/0200587 | A1 | * | 8/2009 | Venezia et al. ................. 257/292 |

FOREIGN PATENT DOCUMENTS
WO    WO/94/14188    6/1994

OTHER PUBLICATIONS

Sameshima, T. et al., "Improvement of SiO2 Properties and Silicon Surface Passivation by Heat Treatment with High-Pressure H20 Vapor", Japan Journal of Applied Physics, vol. 37, Part 2, No. 12A, Dec. 1, 1998, pp. L1452-L1454, Japan Journal of Applied Physics Publication Board, Japan.*
Sameshima, T. et al., "Improvement of SiO2 Properties and Silicon Surface Passivation by Heat Treatment with High-Pressure H2O Vapor", Japan Journal of Applied Physics, vol. 37, Part 2, No. 12A, Dec. 1, 1998, pp. L1452-L1454, Japan Journal of Applied Physics Publication Board, Japan,.
Takato, H. et al., "Surface Passivation Effect of Silicon Substrates due to Quinhydrone/Ethanol Treatment", Japan Journal of Applied Physics, vol. 40, Part 2, No. 10A, Oct. 1, 2001, pp. L1003-L1004,The Japan Society of Applied Physics, Japan.

(Continued)

*Primary Examiner* — Evan Pert
*Assistant Examiner* — Scott Wilson
(74) *Attorney, Agent, or Firm* — Blakely Sokoloff Taylor & Zafman LLP

(57) ABSTRACT

An apparatus and method for fabricating an array of backside illuminated ("BSI") image sensors is disclosed. Front side components of the BSI image sensors are formed into a front side of the array. A dopant layer is implanted into a backside of the array. The dopant layer establishes a dopant gradient to encourage photo-generated charge carriers to migrate towards the front side of the array. At least a portion of the dopant layer is annealed. A surface treatment is formed on the backside of the dopant layer to cure surface defects.

17 Claims, 7 Drawing Sheets

OTHER PUBLICATIONS

Schmidt, J. et al., "Surface passivation of silicon solar cells using plasma-enhanced chemical-vapor-deposited SiN films and thin thermal SiO2/plasma SiN stacks", Semiconductor Science and Technology, vol. 16, 2001, pp. 164-170, Institute of Physics Publishing, United Kingdom.

Kurita, K. et al., "Low Surface Recombination Velocity on Silicon Water Surfaces due to Iodine-Ethanol Treatment", Japanese Journal of Applied Physics, vol. 38, Part 1, No. 10, Oct. 1999, pp. 5710-5714, Japan Journal of Applied Physics Publication Board, Japan.

* cited by examiner

US 7,952,096 B2

CMOS IMAGE SENSOR WITH IMPROVED BACKSIDE SURFACE TREATMENT

TECHNICAL FIELD

This disclosure relates generally to image sensors, and in particular but not exclusively, relates to backside illuminated CMOS image sensors.

BACKGROUND INFORMATION

FIG. 1 illustrates a backside illuminated ("BSI") image sensor 100 including a photodiode ("PD") region 105 disposed within an epitaxial ("epi") layer 110. BSI image sensor 100 is photosensitive to light incident upon the backside of the sensor die. Pixel circuitry for operation of the BSI image sensor is formed over a well 115. Only the transfer transistor and the reset transistor of the pixel circuitry are illustrated. A first metal layer M1 for coupling to the gates of the transfer and reset transistors is disposed within an inter-metal dielectric layer 120.

Backside processing during fabrication of a BSI image sensor can raise the backside surface temperature greatly (e.g., in excess of 1000 C), however for a thick P– epi layer 110, the high temperatures dissipate quickly into the bulk of the silicon. When the silicon is thin, the insulation from inter-metal dielectric layer 120 and the remainder of the back-end-of-the-line ("BEOL") may cause a significant increase in the temperature of epi layer 110, which can result in deleterious effects, such as dopant diffusion at temperatures greater than 800 C and/or BEOL metal deterioration/melting at temperatures greater than 400 C. This problem may be solved by using a thicker final epi layer 110, which can be produced by removing only a portion of the bulk substrate during the backside thinning process. Retaining a thick layer of silicon between the backside and the front side places the high temperature backside surface further away from the dopant profiles and metal/silicide contacts on the front side. However, increasing this thickness results in increased electrical crosstalk between adjacent pixels in an image sensor array.

Difficulties associated with the fabrication of BSI CMOS image sensors ("CIS") include: 1) implanted dopants penetrating too deep and harming the quantum efficiency of the device at short wavelengths, 2) activating all backside dopants to avoid/reduce unactivated defects, and 3) melting the substrate surface with a high energy LASER anneal, which gives rise to surface defects. These defects or surface states can result in high dark current and high white pixel counts. The typical BSI CIS has dark current levels that are over 100 times greater than that of a front side illuminated CIS.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of a system and method for fabricating a backside illuminated ("BSI") imaging sensor are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
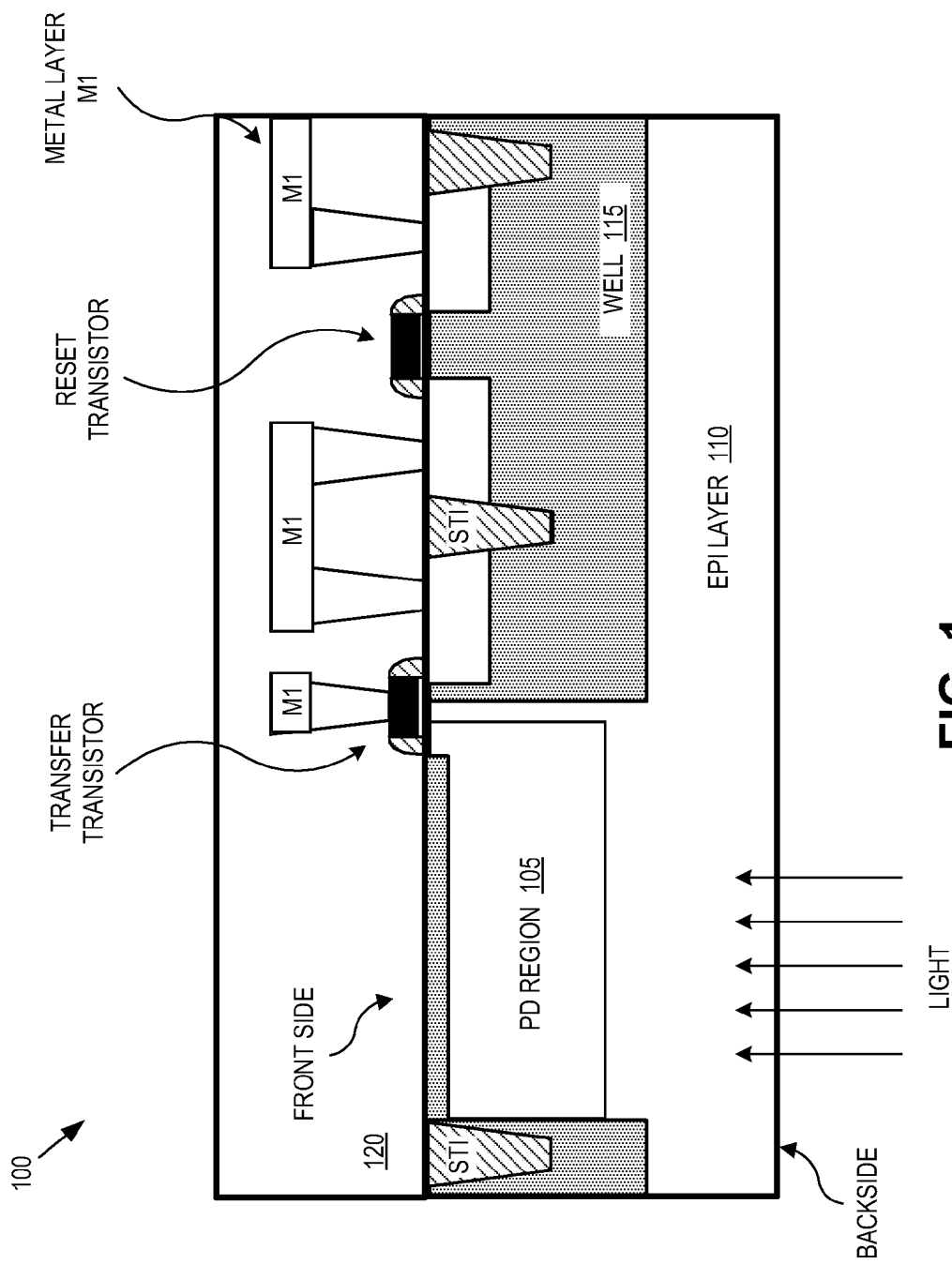
FIG. 1 is a cross sectional view of a backside illuminated image sensor.
Figure 2:
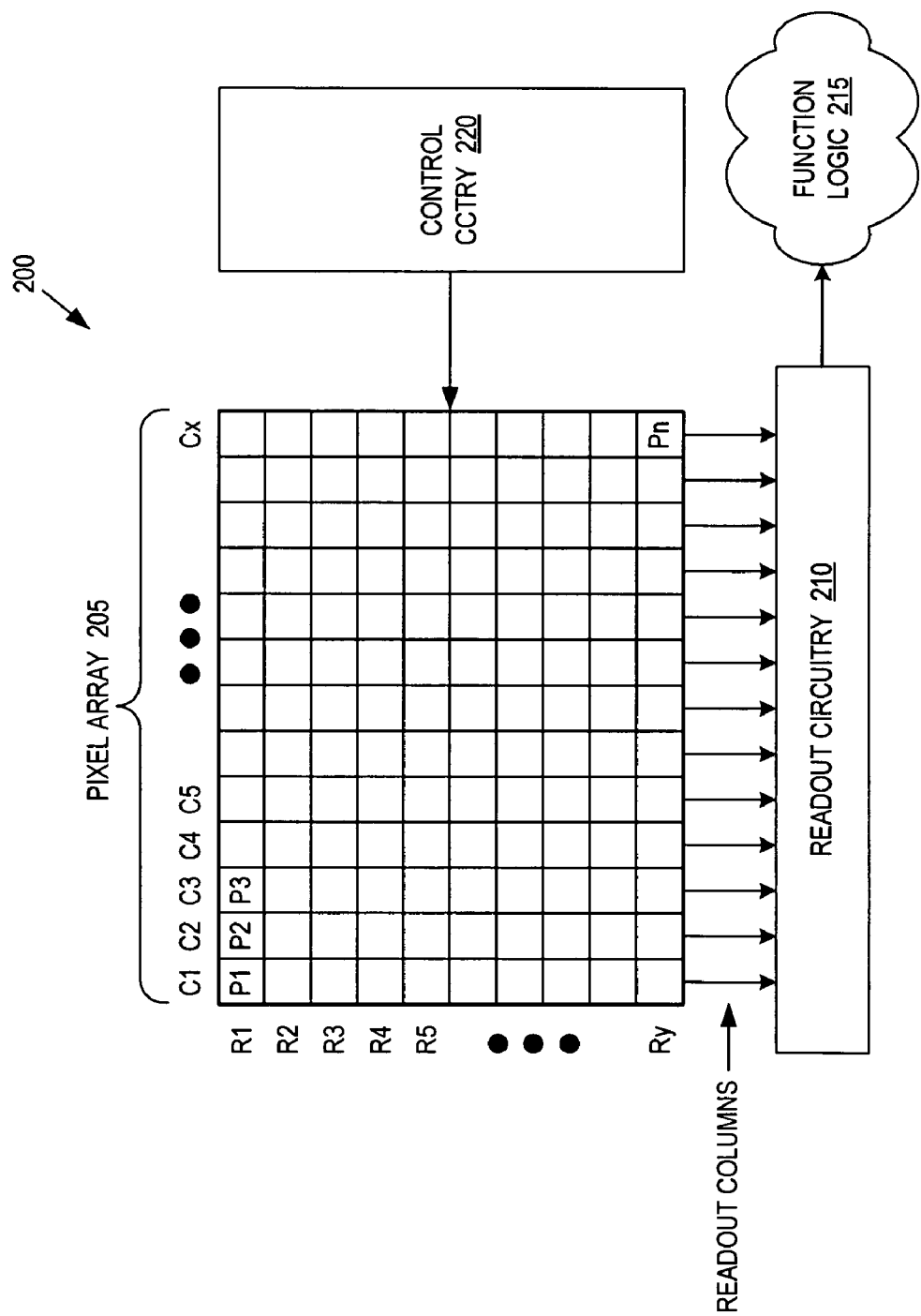
FIG. 2 is a block diagram illustrating a backside illuminated imaging system, in accordance with an embodiment of the invention.

FIG. 2 is a block diagram illustrating a BSI imaging system 200, in accordance with an embodiment of the invention. The illustrated embodiment of imaging system 200 includes a pixel array 205, readout circuitry 210, function logic 215, and control circuitry 220.

Pixel array 205 is a two-dimensional ("2D") array of backside illuminated imaging sensors or pixels (e.g., pixels P1, P2 . . . , Pn). In one embodiment, each pixel is a complementary metal-oxide-semiconductor ("CMOS") imaging pixel. As illustrated, each pixel is arranged into a row (e.g., rows R1 to Ry) and a column (e.g., column C1 to Cx) to acquire image data of a person, place, or object, which can then be used to render a 2D image of the person, place, or object.

After each pixel has acquired its image data or image charge, the image data is readout by readout circuitry 210 and transferred to function logic 215. Readout circuitry 210 may include amplification circuitry, analog-to-digital ("ADC") conversion circuitry, or otherwise. Function logic 215 may simply store the image data or even manipulate the image data by applying post image effects (e.g., crop, rotate, remove red eye, adjust brightness, adjust contrast, or otherwise). In one embodiment, readout circuitry 210 may readout a row of image data at a time along readout column lines (illustrated) or may readout the image data using a variety of other techniques (not illustrated), such as a serial readout or a full parallel readout of all pixels simultaneously.

Control circuitry 220 is coupled to pixel array 205 to control operational characteristic of pixel array 205. For example, control circuitry 220 may generate a shutter signal for controlling image acquisition. In one embodiment, the shutter signal is a global shutter signal for simultaneously enabling all pixels within pixel array 205 to simultaneously capture their respective image data during a single acquisition window. In an alternative embodiment, the shutter signal is a rolling shutter signal whereby each row, column, or group of pixels is sequentially enabled during consecutive acquisition windows.

Figure 3:
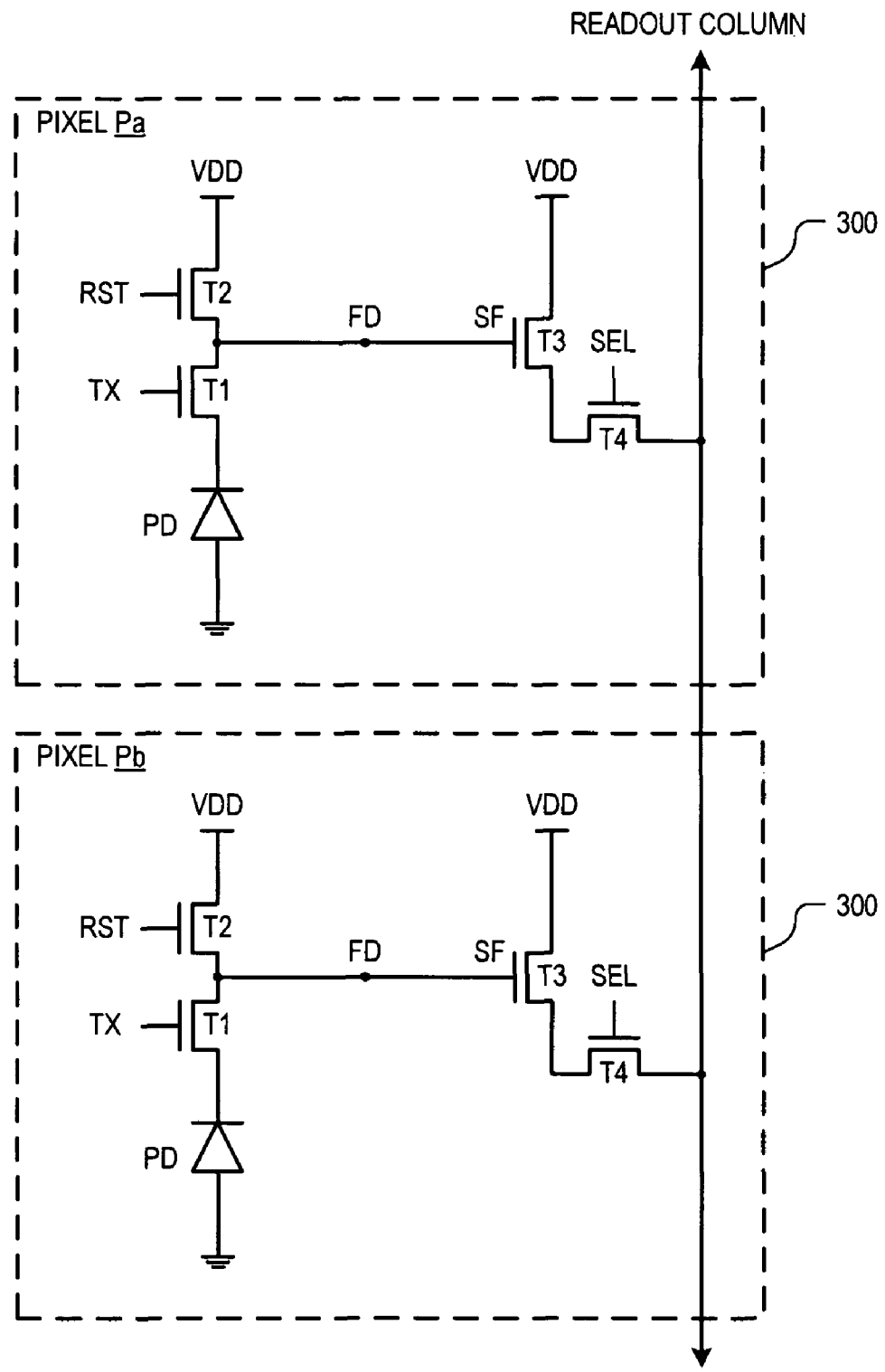
FIG. 3 is a circuit diagram illustrating pixel circuitry of two 4T pixels within a backside illuminated imaging system, in accordance with an embodiment of the invention.

FIG. 3 is a circuit diagram illustrating pixel circuitry 300 of two four-transistor ("4T") pixels within a BSI imaging array, in accordance with an embodiment of the invention. Pixel circuitry 300 is one possible pixel circuitry architecture for implementing each pixel within pixel array 200 of FIG. 2. However, it should be appreciated that embodiments of the present invention are not limited to 4T pixel architectures; rather, one of ordinary skill in the art having the benefit of the instant disclosure will understand that the present teachings are also applicable to 3T designs, 5T designs, and various other pixel architectures.

In FIG. 3, pixels Pa and Pb are arranged in two rows and one column. The illustrated embodiment of each pixel circuitry 300 includes a photodiode PD, a transfer transistor T1, a reset transistor T2, a source-follower ("SF") transistor T3, and a select transistor T4. During operation, reset transistor T2 is coupled between a power rail VDD and the floating diffusion node FD to reset FD (e.g., charge the FD to a preset voltage) under control of a reset signal RST. During an image acquisition window, photo-generated charge carriers (e.g., electrons) accumulate within photodiode PD. Subsequently, transfer transistor T1 receives a transfer signal TX, which transfers the charge accumulated in photodiode PD to floating diffusion node FD. In one embodiment, floating diffusion node FD may be coupled to an additional storage capacitor for temporarily storing image charges.

The floating diffusion node FD is coupled to control the gate of SF transistor T3. SF transistor T3 is coupled between the power rail VDD and select transistor T4. SF transistor T3 operates as a source-follower providing a high impedance output from the pixel. Finally, select transistor T4 selectively couples the output of pixel circuitry 300 to the readout column line under control of a select signal SEL. In one embodiment, the TX signal, the RST signal, and the SEL signal are generated by control circuitry 220.

Figure 4:
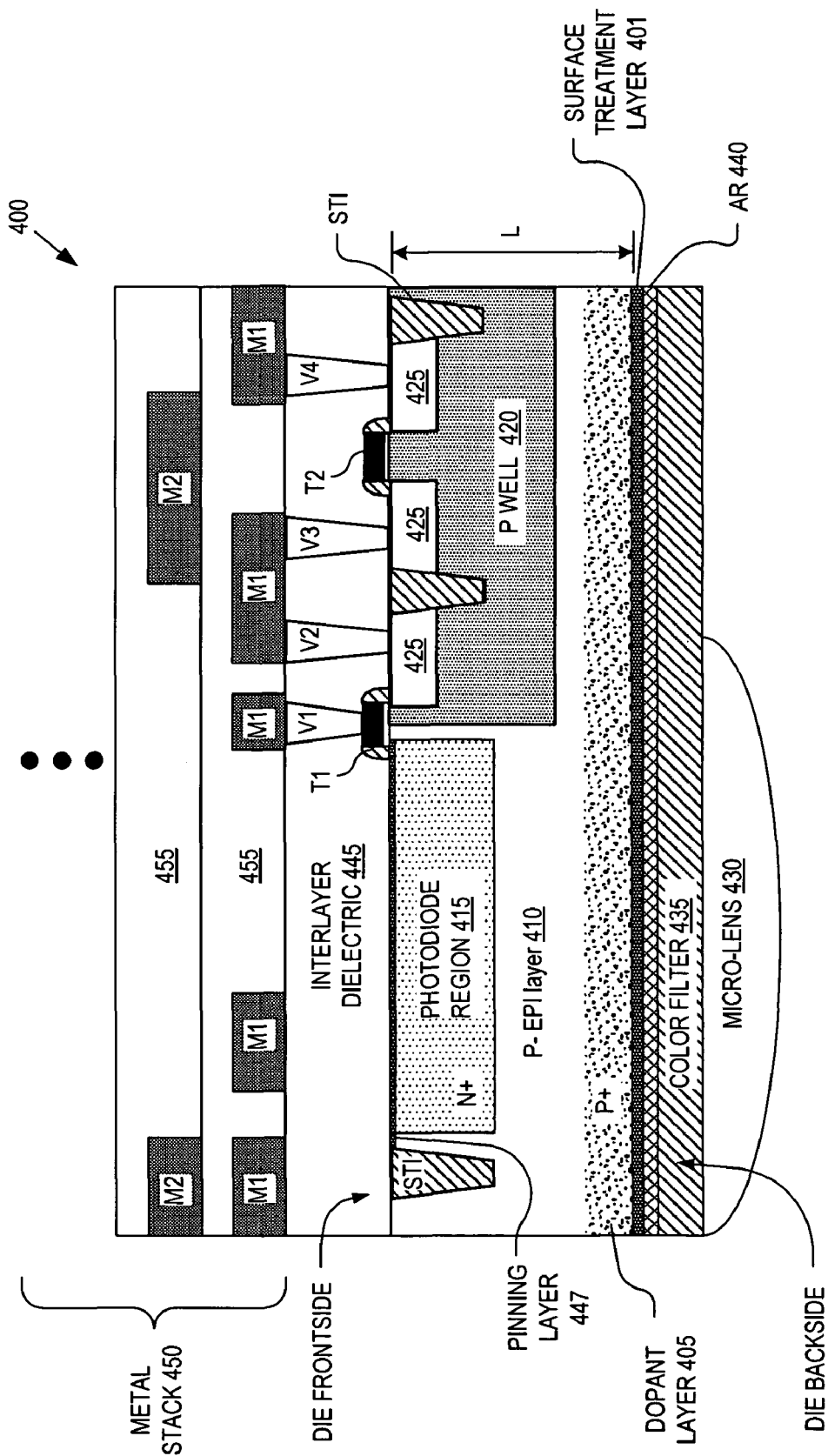
FIG. 4 is a cross sectional view of backside illuminated image sensor having an improved backside surface treatment, in accordance with an embodiment of the invention.

FIG. 4 is a cross sectional view of BSI imaging pixel 400 having an improved backside surface treatment, in accordance with an embodiment of the invention. Imaging pixel 400 is one possible implementation of pixels P1 to Pn within pixel array 205. The illustrated embodiment of imaging pixel 400 includes a surface treatment layer 401, a P+ dopant layer 405, an P− epitaxial ("epi") layer 410, a photodiode region 415, a P well 420, N+ source/drain diffusions 425, pixel circuitry (only transfer transistor T1 and reset transistor T2 are illustrated), a microlens 430, a color filter layer 435, an antireflective ("AR") film 440, an inter-metal dielectric layer 445, a P+ passivation or pinning layer 447, and a metal stack 450. The illustrated embodiment of metal stack 450 includes multiple metal layers (e.g., M1, M2, etc.) separated by inter-metal dielectrics 455, and interconnected with vias (e.g., V1, V2, V3, etc.). Although FIG. 4 illustrates only a two layer metal stack, metal stack 450 may include more or less layers for routing signals over the front side of pixel array 205. Finally, shallow trench isolations ("STI") isolate internal components of imaging pixel 400 and isolate imaging pixel 400 from adjacent pixels (not illustrated). In some embodiments, an additional or alternative AR film may be disposed over the outer surface of microlens 430.

FIG. 4 illustrates BSI imaging pixel 400 formed in a P− epi layer over a P+ substrate. However, it should be appreciated that the starting materials could also be an N− epi layer over an N+ substrate. Similarly, the starting wafer could also include a silicon-on-insulator ("SOI") structure.

Figure 5:
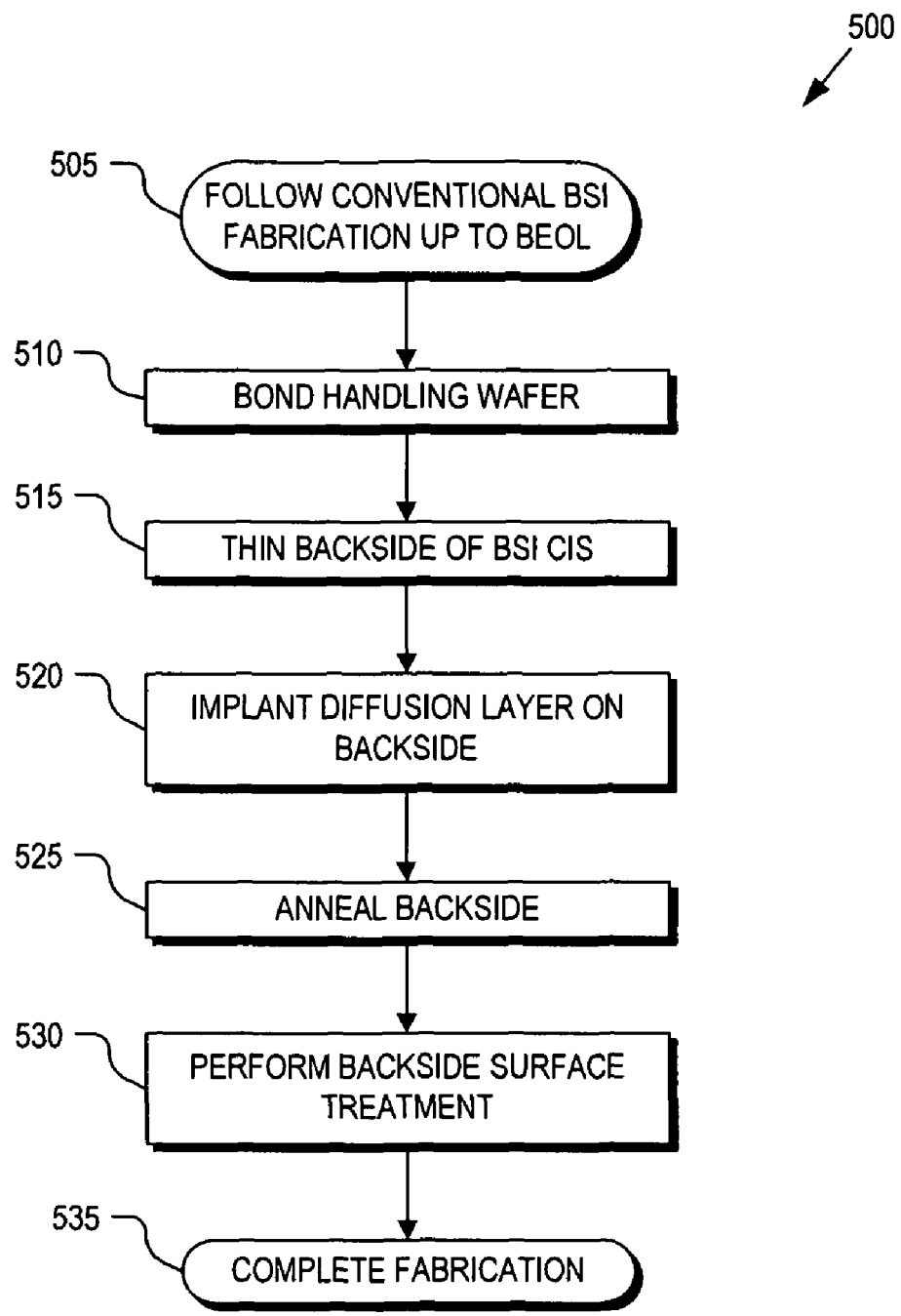
FIG. 5 is a flow chart illustrating a process for fabricating a backside illuminated image sensor with an improved backside surface treatment, in accordance with an embodiment of the invention.

FIG. 5 is a flow chart illustrating a process 500 for fabricating a BSI imaging pixel 400, in accordance with an embodiment of the invention. Process 500 is described with reference to FIGS. 6A-6D. The order in which some or all of the process blocks appear in process 500 should not be deemed limiting. Rather, one of ordinary skill in the art having the benefit of the present disclosure will understand that some of the process blocks may be executed in a variety of orders not illustrated. The below fabrication process illustrates the formation of surface treatment layer 401 in the context of a specific BSI process flow; however, it should be appreciated that surface treatment layer 401 may be added to any number of BSI process flows to cure backside surface defects.

Figure 6A:
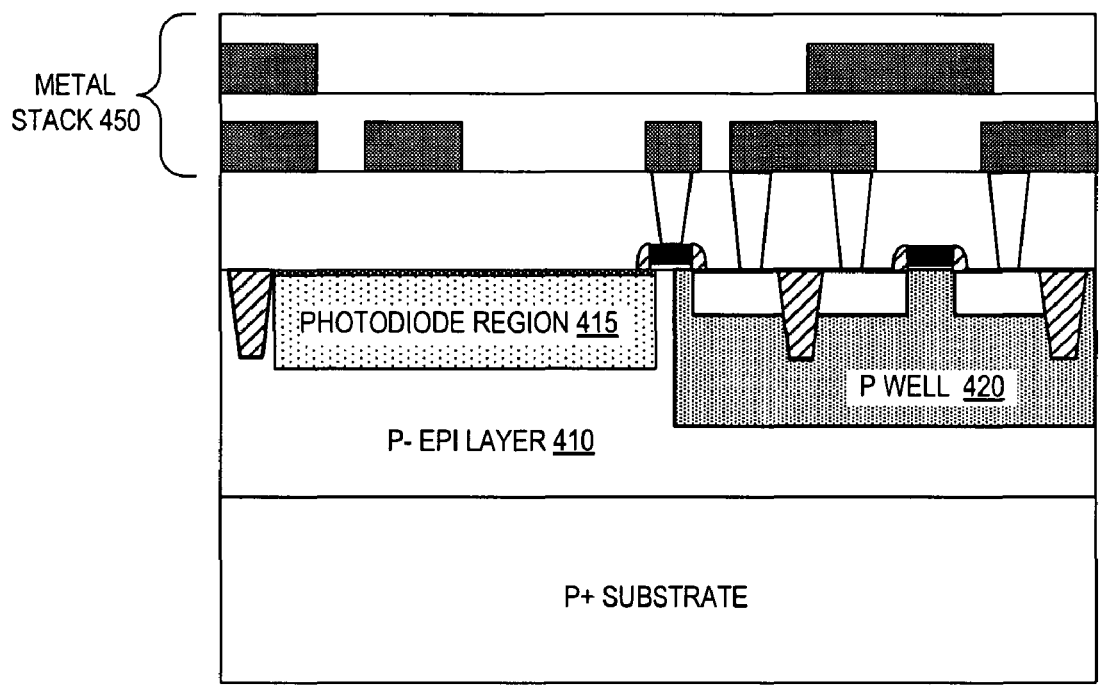
FIG. 6A is a cross sectional view of a partially fabricated backside illuminated image sensor fabricated up to completion of the BEOL, in accordance with an embodiment of the invention.

In a process block 505, fabrication of imaging pixel 400 follows conventional techniques right up to fabrication of the back-end-of-the-line ("BEOL") components including diffusion implants, silicides, pixel transistor circuitry, and metal stack 450 (see FIG. 6A). In a process block 510, a handle wafer is bonded to the front side of the die including the partially fabricated imaging pixel 400. In a process block 515, imaging pixel 400 is backside thinned to remove the P+ substrate and expose P− epi layer 410. Backside thinning may be performed with a combination of chemical mechanical polishing ("CMP") and chemical etching. In one embodiment, the P+ substrate and the P− epi layer 410 are thinned until the remaining thickness L (see FIG. 4) of P− epi layer 410 is less than 4.0 μm, and in some embodiments, the target thickness is between 1.5 μm and 3.0 μm. Of course, thicker target thicknesses of P− epi layer 410 are possible as well.

Figure 6B:
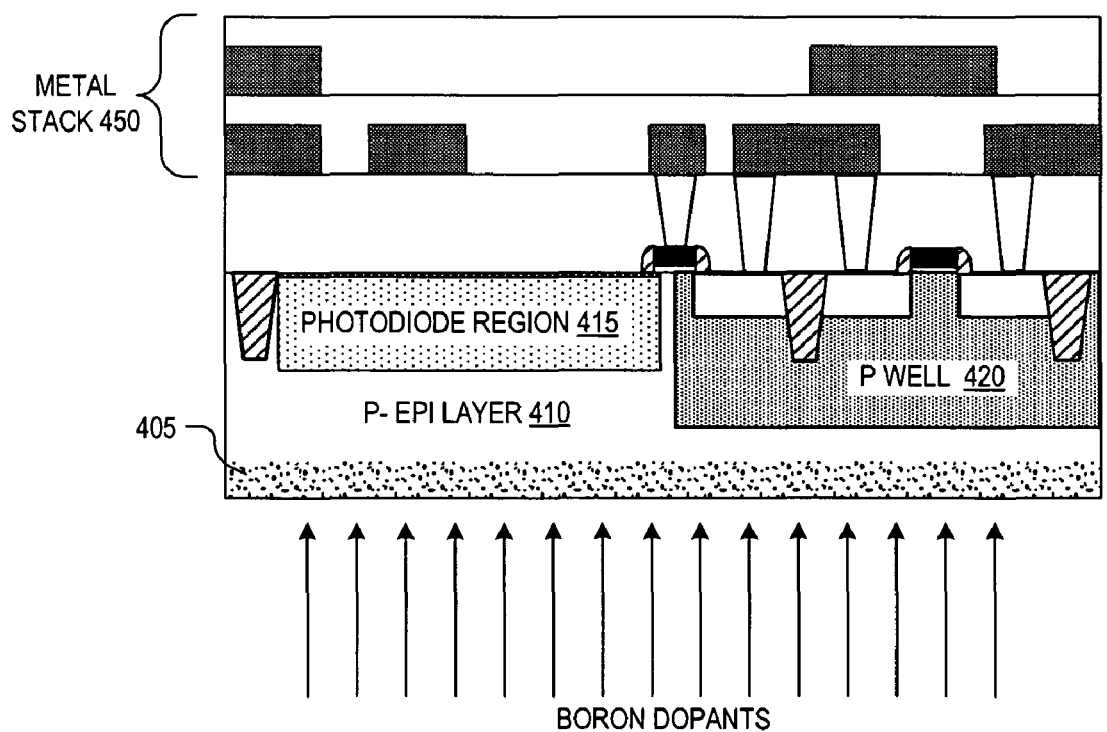
FIG. 6B is a cross sectional view of a partially fabricated backside illuminated image sensor illustrating a dopant layer implant on the backside, in accordance with an embodiment of the invention.
Figure 6C:
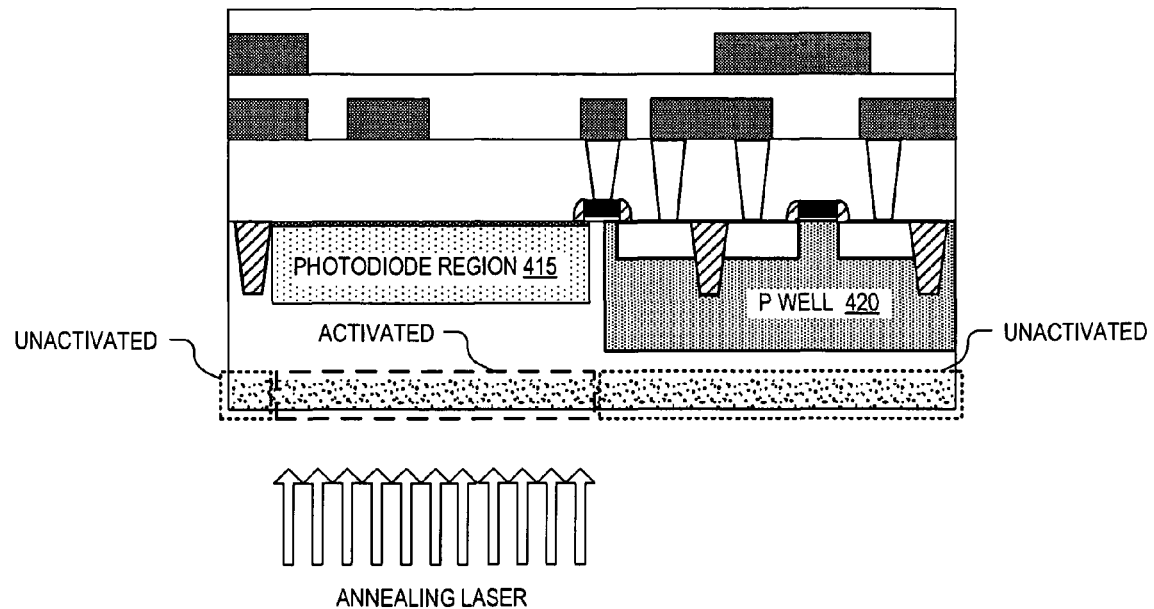
FIG. 6C is a cross sectional view of a partially fabricated backside illuminated image sensor illustrating a laser anneal process, in accordance with an embodiment of the invention.

In a process block 520, dopant layer 405 is implanted into the backside of imaging pixel 400 as a P+ dopant layer (see FIG. 6B). In one embodiment, boron is implanted into the backside surface using established ion implantation techniques. Dopant layer 405 creates a sharp dopant gradient which provides a vertical force for pushing photo-generated electrons vertically towards to the collecting depletion region of the photodiode region 415. Additionally, dopant layer 405 passivates the backside surface of P− epi layer 410 and thereby reduces leakage current from N+ photodiode region 415. In one embodiment, dopant layer 405 is implanted as a blanket layer (illustrated) across the backside. In other embodiments, the backside is masked and patterned to expose regions immediately below PD regions 415 while covering regions below P Wells 420 (not illustrated). After masking, dopant layer 405 is implanted into the exposed regions of P− epi layer 410.

After implantation, dopant layer 405 is annealed (process block 525). In one embodiment, dopant layer 405 is annealed with a short high energy laser pulse (see FIG. 6C). During a laser anneal, the temperature of the annealed surface can rise well above 1000 C, depending on the laser power, penetration depth, and pulse time. The use of a short wavelength annealing laser can help limit the penetration depth, thereby transferring a great portion of the laser energy near the back surface of the wafer. However, the temperature is expected to drop within the semiconductor material (e.g., silicon) due to heat diffusion into the bulk. A BSI structure is basically a semiconductor-on-insulator ("SOI") device, since the silicon active region is isolated from a larger bulk silicon handle substrate by the BEOL dielectric layers. When the silicon active region is thick (L>4 μm), the distance between the back surface and front surface is large enough so that the front surface temperature is significantly lower than the back surface temperature. For example, if the back surface temperature rises to >1000 C, the front surface temperature should still be below 400 C. However, thick silicon increases electrical crosstalk between adjacent pixels. Photo-electrons created near the back surface experience a vertical force towards the front surface due to the back surface P+ doping (i.e., dopant layer 405). In addition to vertical motion created, the electrons move laterally due to diffusion (random motion). The further an electron has to travel to the photodiode collection region, the higher the probability that it diffuses into a neighboring pixel, a phenomena know as electrical crosstalk. Accordingly, the trend in BSI technology is therefore towards thinner silicon thickness (L<4 μm) to reduce electrical crosstalk.

Reducing the silicon thickness introduces process complexities in terms of laser annealing the backside dopant layer 405. As described above, the temperature rise at the front surface will be greater for thin silicon. Accordingly, in some embodiments, a laser anneal mask (not illustrated) is deposited on the die or wafer backside and patterned to only expose those areas immediately below PD regions 415. When the annealing laser is scanned across the die or wafer backside (see FIG. 6C) only the uncovered portion of dopant layer 405 is exposed to the laser, so only the boron in this exposed area is activated. The thickness and composition of the laser anneal mask are laser and process dependent; however, the composition and thickness should be chosen to have a high reflectively to the laser wavelength.

Masking the die backside prior to the laser anneal of dopant layer 405 provides a number of advantages. The amount of energy absorbed by the silicon is reduced, thereby reducing the temperature rise of the die. There are typically no metal/silicide contacts above photodiode region 415 and therefore the front surface can tolerate a larger temperature rise than regions with metal contacts. Metal contacts will typically degrade above 400 C, but dopant profiles typically do not diffuse below 800 C. The periphery circuit around photodiode region 415 and pixel array 205 is protected from the harmful effects of the laser anneal process. The P+ type ion implant under the masked back surface area is not exposed and therefore is not activated creating a high recombination region. Electrons that migrate to or are formed in this region will recombine easily reducing crosstalk.

Figure 6D:
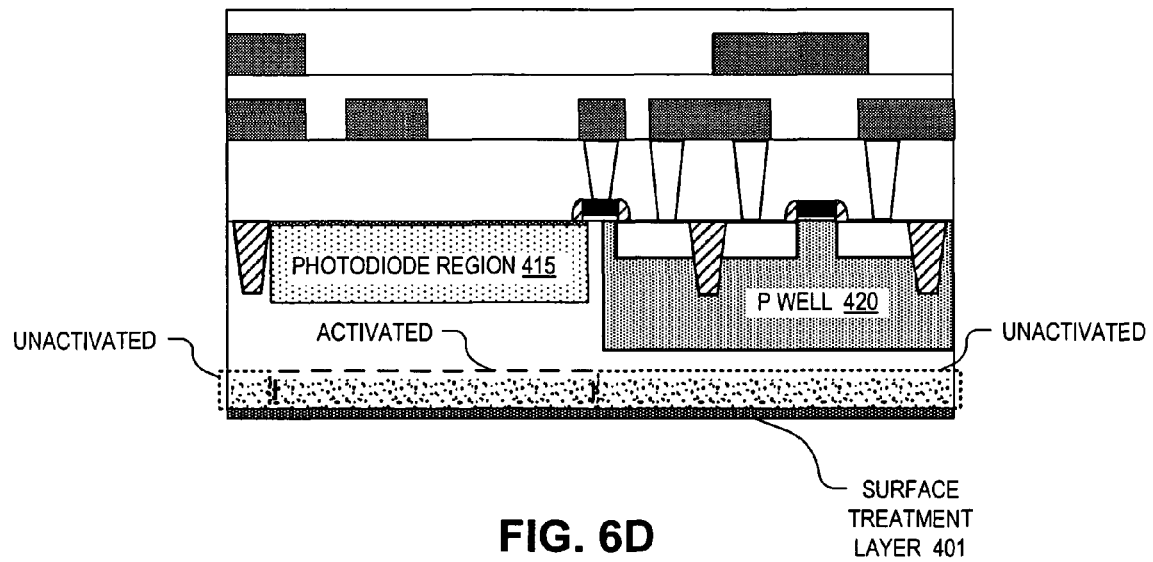
FIG. 6D is a cross sectional view of a partially fabricated backside illuminated image sensor illustrating an improved surface treatment process, in accordance with an embodiment of the invention.

In a process block 530, a backside surface treatment layer 401 is applied to further passivate the backside of epi layer 410 and cure surface defects (see FIG. 6D). Surface treatment may include exposing the backside silicon surface to a gas or liquid containing a reducing or oxidizing species to reduce backside surface states. These species may include $H_2$, $H_2O$, $N_2O$, $O_2$, $O_3$, and $H_2O_2$, among others. Curing defects and reducing surface states advantageously can reduce dark current and white pixels.

In one embodiment, the surface treatment is an oxidation of the backside to create a surface oxide. The oxidation can be done at temperatures ranging from 150° C. to 1000° C. If $H_2O$ (water) is used as one of the oxidizing species, process block 530 could be performed at temperatures ranging from 150° C. to 500° C. (though a temperature range of 250° C. to 450° C. may be preferable). Increasing the chamber pressure with a high pressure oxidation using $H_2O$ may enable lower temperatures while still achieve surface oxidation (e.g., 300° C. to 400° C.). The temperatures should be chosen so as not to damage the circuit metallization. Alternative oxidizing agents include Iodine or Iodine in an Ethanol solution. Other oxidization agents may be used as well.

At the higher temperatures, the oxidizing can be achieved by introducing an oxidizing ambient during the anneal or laser anneal process to activate dopant layer 405. In this case, process blocks 525 and 530 are merged into a single process block.

After creation of surface treatment layer 401, fabrication of imaging pixel 400 is completed with the addition of AR film 440, color filter 435, and microlens 430 (process block 535).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A method of fabricating an array of backside illuminated ("BSI") image sensors, comprising:
    fabricating front side components of the BSI image sensors into a front side of the array;
    implanting a dopant layer into a backside of the array, the dopant layer establishing a dopant gradient to encourage photo-generated charge carriers to migrate towards the front side of the array;
    annealing at least a portion of the dopant layer; and
    forming a surface treatment on a backside of the dopant layer to cure surface defects,
    wherein the annealing includes laser annealing,
    wherein forming the surface treatment on the backside of the dopant layer includes exposing the backside of the dopant layer to an ambient oxidizing species during the laser annealing.

2. The method of claim 1, wherein forming the surface treatment comprises forming a surface oxide layer.

3. The method of claim 2, wherein forming the surface oxide layer comprises exposing the backside of the dopant layer to the ambient oxidizing species.

4. The method of claim 3, wherein the ambient oxidizing species includes one or more of $H_2$, $H_2O$, $N_2O$, $O_2$, $O_3$, $H_2O_2$, iodine, or iodine in an ethanol solution.

5. The method of claim 3, wherein the ambient oxidizing species comprises $H_2O$ and wherein exposing the backside of the dopant layer to the ambient oxidizing species comprises exposing the backside of the dopant layer to the ambient oxidizing species at a temperature range between 250° C. to 450 ° C.

6. The method of claim 1, wherein fabricating the front side components of the BSI image sensors into the front side of the array comprises:
    forming photodiode regions and associated pixel circuitry on or within a front side of an epitaxial layer disposed over a semiconductor substrate;

forming a metal stack over the front side of the epitaxial layer; and removing the semiconductor substrate from a backside of the epitaxial layer.

7. The method of claim 6, further comprising thinning the epitaxial layer to between 1.5 µm and 3.0 µm thick.

8. A backside illuminated ("BSI") complementary metal-oxide semiconductor ("CMOS") image sensor array, comprising:

an array of photosensitive regions disposed within a semiconductor layer, the photosensitive regions sensitive to light incident on a backside of the BSI CMOS image sensor array;

a dopant layer disposed in a backside of the semiconductor layer establishing a dopant gradient to encourage photo-generated charge carriers to migrate towards a front side of the array; and a surface treatment layer on the backside of the dopant layer to cure surface defects, wherein the dopant layer is patterned to include annealed activated portions extending below the photosensitive regions and non-annealed unactivated portions not below the photosensitive regions.

9. The BSI CMOS image sensor array of claim 8 wherein the surface treatment layer comprises an oxide layer.

10. The BSI CMOS image sensor array of claim 9, wherein the oxide layer comprises an oxide formed from an oxidizing species including one or more of $H_2$, $H_2O$, $N_2O$, $O_2$, $O_3$, $H_2O_2$, iodine, or iodine in an ethanol solution.

11. The BSI CMOS image sensor array of claim 9, wherein the dopant layer comprises boron doped silicon.

12. The BSI CMOS image sensor array of claim 9, wherein the semiconductor layer comprises an epitaxial layer having a thickness of between 1.5 µm and 3.0 µm.

13. The BSI CMOS image sensor array of claim 9, wherein the anneal activated portions were laser annealed and non-annealed unactivated portions were not laser annealed.

14. The BSI CMOS image sensor array of claim 8, wherein the semiconductor layer comprises a N−doped epitaxial layer and the dopant layer comprises a N+doped layer.

15. The BSI CMOS image sensor array of claim 8, wherein the semiconductor layer comprises a P−doped epitaxial layer and the dopant layer comprises a P+doped layer.

16. The BSI CMOS image sensor array of claim 8, further comprising:

a metal stack disposed over a front side of the BSI CMOS image sensor array for routing electrical signals over the front side; and an array of microlens disposed on the backside of the BSI CMOS image sensor array to focus light into the array of photosensitive regions.

17. The BSI CMOS image sensor array of claim 8, further comprising an antireflective layer, wherein the surface treatment layer resides between the dopant layer and the antireflective layer.

* * * * *